US012761302B2

(12) United States Patent
Chatterjee et al.

(10) Patent No.: US 12,761,302 B2
(45) Date of Patent: Oct. 13, 2026

(54) SINGLE COIL DEEP LEARNING BASED MAGNETIC RESONANCE IMAGING SYSTEM AND METHOD

(71) Applicant: GE Precision Healthcare LLC, Waukesha, WI (US)

(72) Inventors: Sudhanya Chatterjee, Bengaluru (IN); Harsh Kumar Agarwal, Bengaluru (IN); Florintina C, Bengaluru (IN); Rohan Keshav Patil, Jalgaon (IN); Suresh Emmanuel Devadoss Joel, Bengaluru (IN); Sajith Rajamani, Bengaluru (IN)

(73) Assignee: GE Precision Healthcare LLC, Waukesha, WI (US)

( * ) Notice: Subject to any disclaimer, the term of this patent is extended or adjusted under 35 U.S.C. 154(b) by 212 days.

(21) Appl. No.: 18/665,381

(22) Filed: May 15, 2024

(65) Prior Publication Data

US 2024/0385267 A1 Nov. 21, 2024

Related U.S. Application Data

(60) Provisional application No. 63/502,467, filed on May 16, 2023.

(51) Int. Cl.
*G01V 3/00* (2006.01)
*G01R 33/385* (2006.01)
(Continued)

(52) U.S. Cl.
CPC ....... *G01R 33/4818* (2013.01); *G01R 33/385* (2013.01); *G01R 33/5608* (2013.01)

(58) Field of Classification Search
CPC .............. G01R 33/4818; G01R 33/385; G01R 33/5608
(Continued)

(56) References Cited

U.S. PATENT DOCUMENTS

2018/0017652 A1* 1/2018 Ye ...................... G01R 33/5608
2021/0118200 A1* 4/2021 Akcakaya .............. G06T 12/10
2021/0264645 A1* 8/2021 Polak ..................... G16H 30/40

FOREIGN PATENT DOCUMENTS

CN 110009674 A * 7/2019 ............. G06T 7/593
CN 108957375 B * 12/2020 ............. G01R 33/48
(Continued)

OTHER PUBLICATIONS

Chen et al., "Variable-Density Single-Shot Fast Spin-Echo MRI with Deep Learning Reconstruction by Using Variational Networks," Radiology. Nov. 2018;289(2):366-373. doi: 10.1148/radiol.2018180445. Epub Jul. 24, 2018. PMID: 30040039; PMCID: PMC6209075, 8 pages.
(Continued)

*Primary Examiner* — Walter L Lindsay, Jr.
*Assistant Examiner* — Frederick Wenderoth
(74) *Attorney, Agent, or Firm* — Fletcher Yoder, P.C.

(57) ABSTRACT

A method for magnetic resonance imaging (MRI) includes determining a Partial Fourier (PF) factor and an acceleration factor for acquiring k-space data from a subject. The method also includes acquiring a set of k-space data from the subject using the PF factor along with an under-sampling technique, wherein the under-sampling technique is dependent on the acceleration factor. The image of the subject is reconstructed by processing the set of k-space data using a deep learning (DL) network.

20 Claims, 7 Drawing Sheets

(51) Int. Cl.
*G01R 33/48* (2006.01)
*G01R 33/56* (2006.01)

(58) Field of Classification Search
USPC .......................................................... 324/309
See application file for complete search history.

(56) References Cited

FOREIGN PATENT DOCUMENTS

| | | | | | |
|---|---|---|---|---|---|
| CN | 108335339 | B | * | 10/2021 | ............. G06T 12/00 |
| WO | WO-2015197363 | A1 | * | 12/2015 | ............. A61B 5/113 |
| WO | WO-2022040449 | A1 | * | 2/2022 | ............. A61B 5/055 |

OTHER PUBLICATIONS

Shanbhogue et al. "Accelerated single-shot T2-weighted fat-suppressed (FS) MRI of the liver with deep learning-based image reconstruction: qualitative and quantitative comparison of image quality with conventional T2-weighted FS sequence." Eur Radiol 31, 8447-8457 (2021). https://doi.org/10.1007/s00330-021-08008-3, 11 pages.

* cited by examiner

SINGLE COIL DEEP LEARNING BASED MAGNETIC RESONANCE IMAGING SYSTEM AND METHOD

CROSS REFERENCE TO RELATED APPLICATIONS

The present application claims priority to U.S. provisional patent application Ser. No. 63/502,467 filed May 16, 2023, incorporated herein by reference in its entirety.

BACKGROUND

The field of the disclosure relates generally to medical technologies, and more particularly, to a system and method for imaging a subject.

As a medical imaging modality, Magnetic resonance imaging (MRI), can obtain images of the human body without using X-rays or other ionizing radiation. MRI uses a magnet having a strong magnetic field to generate a static magnetic field B0. When a part of the human body to be imaged is positioned in the static magnetic field B0, nuclear spin associated with hydrogen nuclei in human tissue is polarized, so that the tissue of the to-be-imaged part generates a longitudinal magnetization vector at a macroscopic level. After a radio-frequency field B1 intersecting the direction of the static magnetic field B0 is applied, the direction of rotation of protons changes so that the tissue of the to-be-imaged part generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the to-be-imaged part can be reconstructed based on the acquired signal.

Obesity is common cause of multiple of disease leading to the requirement of an abdominal MRI. Single-Shot Fast-Spin-Echo (SSFSE) SSFSE is commonly used in acquiring 2 dimensional (2D) high resolution MR images of motion sensitive anatomies such as abdomen. SSFSE involves acquiring all the phase encoding lines in k-space together. In some embodiments, fast MRI methods are used to reduce the number of phase encoding k-space lines and hence total readout times in SSFSE acquisition. For example, the fast MRI methods such as Partial Fourier (PF) MRI and parallel imaging (PI) fast MRI techniques are commonly used in multi-coil MRI setups. However, the use of multi-coil setup for obese patient in non-wide bore commercial MRI systems is challenging requiring single channel body coil acquisition. Using single coil presents its own set of challenges—(1) higher blurring even while using high levels of PF due to higher echo spacing, (2) low signal-to-noise ratio (SNR). The PI MRI cannot be used with single channel coil and PF MRI alone does not reduce the number of phase encoding lines sufficiently enough to obtain clinically acceptable image quality. In such scenarios additional acceleration is required with PF factors.

Therefore, there is a need for an improved magnetic resonance imaging system and method.

DRAWINGS

These and other features, aspects, and advantages of the present invention will become better understood when the following detailed description is read with reference to the accompanying drawings in which like characters represent like parts throughout the drawings, wherein.

BRIEF DESCRIPTION

Figure 1:
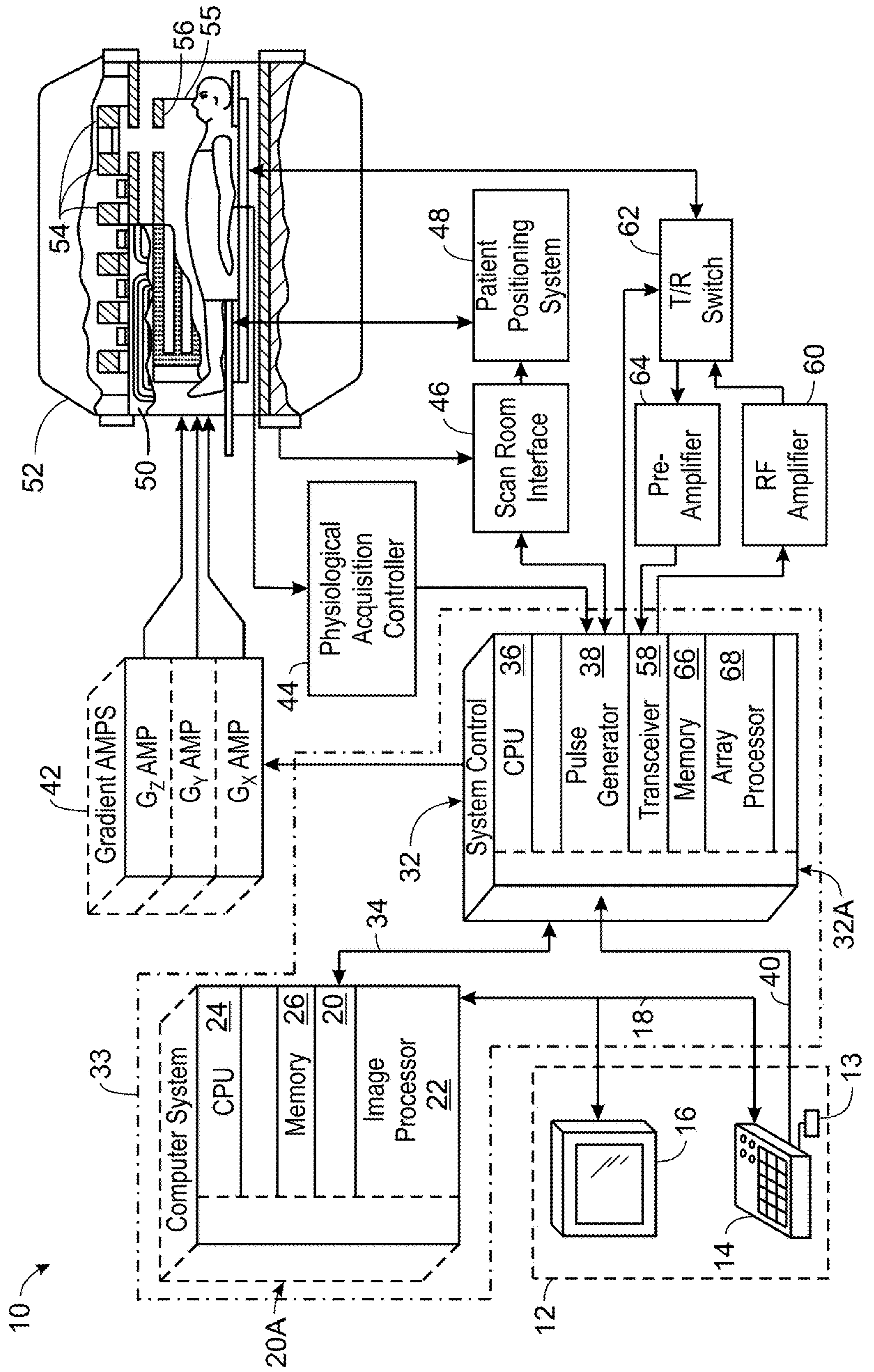
FIG. 1 shows a diagram of an exemplary magnetic resonance imaging (MRI) system, in accordance with an embodiment of the present technique.

In accordance with an embodiment of the present technique a method for magnetic resonance imaging (MRI) is provided. The method includes determining a Partial Fourier (PF) factor and an acceleration factor for acquiring k-space data from a subject. The method further includes acquiring a set of k-space data from the subject using the PF factor along with an under-sampling technique. The under-sampling technique is dependent on the acceleration factor. An image of the subject is then reconstructed by processing the set of k-space data using a deep learning (DL) network.

In accordance with another embodiment of the present technique, a magnetic resonance imaging (MRI) system is presented. The MRI system includes a magnet configured to generate a polarizing magnetic field about at least a portion of a subject arranged in the MRI system and a gradient coil assembly including a plurality of gradient coils configured to apply at least one gradient field to the polarizing magnetic field. The MRI system also includes a radio frequency (RF) system configured to apply an RF field to the subject and to receive magnetic resonance signals from the subject. The MRI system further includes a processing system programmed to determine a Partial Fourier (PF) factor and an acceleration factor, which specifies a degree of Partial Fourier sampling, for acquiring k-space data from the subject. The processing system is further programmed acquire a set of k-space data from the subject using the PF factor along with an under-sampling technique and reconstruct an image of the subject by processing the set of k-space data using a deep learning (DL) network. The under-sampling technique is dependent on the acceleration factor.

In accordance with yet another embodiment of the present technique, a non-transitory computer-readable medium comprising instructions, which when executed by a computer, cause the computer to carry out a method for magnetic resonance imaging (MRI) is provided. The method includes determining a Partial Fourier (PF) factor and an acceleration factor for acquiring k-space data from a subject and acquiring a set of k-space data from the subject using the PF factor along with an under-sampling technique. The under-sampling technique is dependent on the acceleration factor. The method further includes reconstructing an image of the subject by processing the set of k-space data using a deep learning (DL) network.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present embodiments, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments. Furthermore, the terms "circuit" and "circuitry" and "controller" may include either a single component or a plurality of components, which are either active and/or passive and are connected or otherwise coupled together to provide the described function.

Single shot fast spin echo (SSFSE) is a popular imaging approach for acquisition of high-resolution MR images in motion sensitive areas such as abdomen. In certain clinical settings, use of multiple coils setup for acquisition is not feasible (such as abdominal scans for obese subjects in non-wide bore MRI scanners). SSFSE imaging with single coil using the popular partial Fourier approach only presents risk of excessive blurring in the images. In the present disclosure, a method to enable SSFSE T2 imaging using single coil is proposed.

Embodiments of the present disclosure will now be described, by way of an example, with reference to the figures, in which FIG. 1 is a schematic diagram of a magnetic resonance imaging (MRI) system 10. Operation of the system 10 may be controlled from an operator console 12, which includes an input device 13, a control panel 14, and a display screen 16. The input device 13 may be a mouse, joystick, keyboard, track ball, touch activated screen, light wand, voice control, and/or other input device. The input device 13 may be used for interactive geometry prescription. The console 12 communicates through a link 18 with a computer system 20 that enables an operator to control the production and display of images on the display screen 16. The link 18 may be a wireless or wired connection. The computer system 20 may include modules that communicate with each other through a backplane 20*a*. The modules of the computer system 20 may include an image processor module 22, a central processing unit (CPU) module 24, and a memory module 26 that may include a frame buffer for storing image data arrays, for example. The computer system 20 may be linked to archival media devices, permanent or back-up memory storage or a network for storage of image data and programs and communicates with MRI system control 32 through a high-speed signal link 34. The MRI system control 32 may be separate from or integral with the computer system 20. The computer system 20 and the MRI system control 32 collectively form an "MRI controller" 33 or "controller".

In the exemplary embodiment, the MRI system control 32 includes modules connected by a backplane 32*a*. These modules include a CPU module 36 as well as a pulse generator module 38. The CPU module 36 connects to the operator console 12 through a data link 40. The MRI system control 32 receives commands from the operator through the data link 40 to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to components that are operated by the MRI controller 32, including the pulse generator module 38 which controls a gradient amplifier 42, a physiological acquisition controller (PAC) 44, and a scan room interface circuit 46.

In one example, the CPU module 36 receives patient data from the physiological acquisition controller 44, which receives signals from sensors connected to the subject, such as ECG signals received from electrodes attached to the patient. The CPU module 36 receives, via the scan room interface circuit 46, signals from the sensors associated with the condition of the patient and the magnet system. The scan room interface circuit 46 also enables the MRI controller 33 to command a patient positioning system 48 to move the patient to a desired position for scanning.

A whole-body RF coil 56 is used for transmitting the waveform towards subject anatomy. The whole body-RF coil 56 may be a body coil. An RF coil may also be a local coil that may be placed in more proximity to the subject anatomy than a body coil. The RF coil 56 may also be a surface coil. RF coils containing RF receiver channels may be used for receiving the signals from the subject anatomy. Typical surface coil would have eight receiving channels; however, different number of channels are possible. However, the present technique also works with a single coil which is the default body coil of the scanner. Since imaging using the body coil only does not involve putting surface coil on the subject, it can offer more comfort to the patient during the scan. Additionally, it shall also make the patient setup workflow simpler.

The pulse generator module 38 may operate the gradient amplifiers 42 to achieve desired timing and shape of the gradient pulses that are produced during the scan. The gradient waveforms produced by the pulse generator module 38 may be applied to the gradient amplifier system 42 having Gx, Gy, and Gz amplifiers. Each gradient amplifier excites a corresponding physical gradient coil in a gradient coil assembly 50, to produce the magnetic field gradients used for spatially encoding acquired signals. Specifically, Gx corresponds to a flow/frequency encoding gradient, Gy corresponds to a phase encoding gradient and Gz corresponds to a slice select gradient. The gradient coil assembly 50 may form part of a magnet assembly 52, which also includes a polarizing magnet 54 (which, in operation, provides a longitudinal magnetic field $B_0$ throughout a target volume 55 that is enclosed by the magnet assembly 52 and a whole-body RF coil 56 (which, in operation, provides a transverse magnetic field B1 that is generally perpendicular to B0 throughout the target volume 55. A transceiver module 58 in the MRI system control 32 produces pulses (e.g., RF pulses) that may be amplified by an RF amplifier 60 and coupled to the RF coil 56 by a transmit/receive switch 62. The resulting signals (i.e., MR signals which include echo signals) emitted by the excited nuclei in the subject anatomy may be sensed by receiving coils (not shown) and provided to a preamplifier 64 through the transmit/receive switch 62. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the receiving coil during the receive mode.

The MR signals produced from excitation of the target are digitized by the transceiver module 58. The MR system control 32 then processes the digitized signals by Fourier transform to produce k-space data, which is transferred to a memory module 66, or other computer readable media, via the MRI system control 32. "Computer readable media" may include, for example, structures configured so that electrical, optical, or magnetic states may be fixed in a manner perceptible and reproducible by a conventional computer (e.g., text or images printed to paper or displayed on a screen, optical discs, or other optical storage media, "flash" memory, EEPROM, SDRAM, or other electrical storage media; floppy or other magnetic discs, magnetic tape, or other magnetic storage media).

A scan is complete when an array of raw k-space data has been acquired in the computer readable media 66. This raw k-space data is rearranged into separate k-space data arrays for each image to be reconstructed, and each of these k-space data arrays is input to an array processor 68, which operates to reconstruct the data into an array of image data, using a reconstruction algorithm such as a Fourier transform. When the full k-space data is obtained, it represents entire volume of the subject body and the k-space so obtained may be referred as the reference k-space. Similarly, when only the partial k-space data is obtained, the image may be referred as the partial k-space. This image data is conveyed through the data link 34 to the computer system 20 and stored in memory. In response to the commands received from the operator console 12, this image data may be archived in a long-term storage or may be further processed by the image processor 22 and conveyed to the operator console 12 and presented on the display 16.

MR signals are represented by complex numbers, where each location at the k-space is represented by a complex number, with I and Q quadrature MR signals being the real and imaginary components. Complex MR images may be reconstructed based on I and Q quadrature MR signals, using processes such as Fourier transform of the k-space MR data. Complex MR images are MR images with each pixel represented by a complex number, which also has a real component and an imaginary component. The magnitude M of the received MR signal may be determined as the square root of the sum of the squares of the I and Q quadrature components of the received MR signal as in Eq. (3) below:

$$M = \sqrt{I^2 + Q^2} \tag{1}$$

and the phase $\phi$ of the received MR signal may also be determined as in eq. (2) below:

$$\phi = \tan^{-1}\left(\frac{Q}{I}\right) \tag{2}$$

In summary, during a medical scan, raw k-space data is acquired and rearranged into separate k-space data arrays for image reconstruction. The array processor then transforms this data into an array of image data using techniques like the Fourier transform. When the full k-space data is obtained, it represents the entire volume of the subject's body (referred to as the reference k-space). There are several acquisition techniques to acquire k-space data, each with its advantages and applications. Rectilinear sampling, radial sampling, spiral sampling, echo Planar imaging, parallel imaging are some k-space acquisition techniques by which k-space data can be obtained.

Abdominal imaging typically involves patients lying still in an MRI scanner for long periods. However, this can be uncomfortable and any movement can lead to images with motion artifacts, which might render them as non-diagnostic. To address these challenges, in one embodiment, rapid imaging techniques like Single Shot Fast Spin Echo (SSFSE) T2 scans are used for abdominal imaging. SSFSE T2 scans are rapid because they acquire the complete k-space, which contain multiple pieces of information related to T2 relaxation times such as tissue type, fluid presence etc., in a single shot, thus minimizing the time patients need to remain still and reducing the likelihood of motion artifacts. As will be appreciated by those skilled in the art, T2 relaxation time refers to the time it takes for the transverse magnetization to decay or lose coherence after a radiofrequency pulse is applied during an MRI scan. In one embodiment of the present disclosure, a method to enable SSFSE T2 imaging using only a single coil is proposed.

At times, to expedite MRI scans, only a portion of the k-space data is captured, creating what's known as a partial k-space image. To ensure this partial image is sharp and precise, specific processing steps may be taken. For example, when conducting SSFSE T2 scans for the abdomen, the length of the echo train (ETL) may be adjusted. As will be appreciated by those skilled in the art, ETL refers to the number of echoes collected within a single repetition time (TR) in a MR pulse sequence. In other words, a number of k-space lines to be acquired in the single shot may be called as ETL. A shorter ETL means that fewer echoes are acquired during each TR, which can speed up the imaging process. In one embodiment, the ETL may be selected so as to avoid excessive blurring in the T2 details of the image such as image artifacts and tissue characteristics. However, in certain cases, just using aggressive level of Partial Fourier (PF) factors (i.e., acquiring a large portion of the k-space data) is not sufficient to avoid excessive T2 blurring in the acquired data. Therefore, in one embodiment of the present technique, under-sampling of k-space is performed in addition to the PF step. The PF step basically involves deliberately discarding some k-space lines in one half of the k-space based on a PF factor (which represents a degree of Partial Fourier sampling) whereas the under-sampling includes using specific patterns to discard k-space lines. In accordance with an embodiment of the present technique, a technique to acquire k-space using PF and under sampling scheme is proposed.

Figure 2:
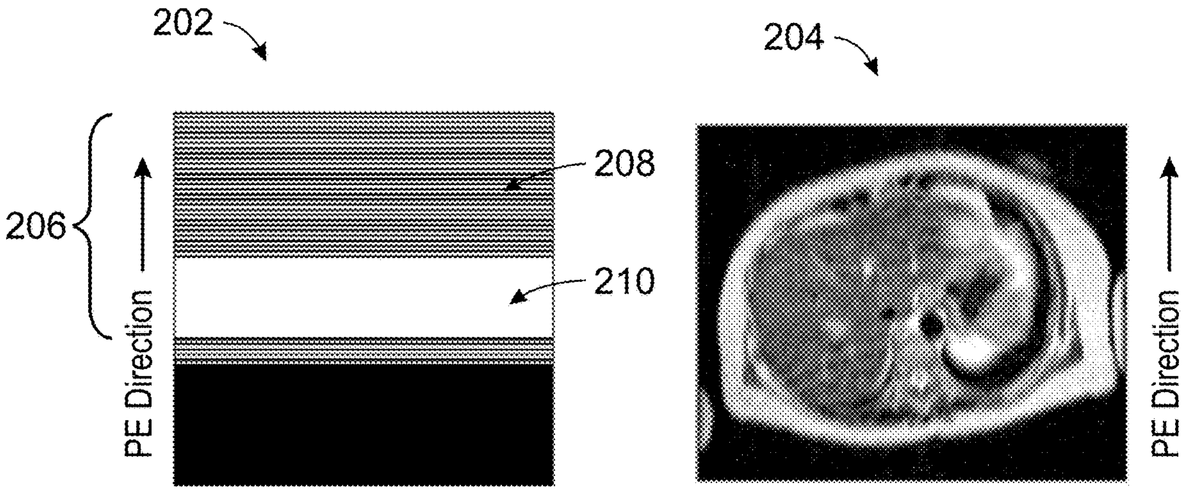
FIG. 2 shows an example k-space acquired using a Partial Fourier and under-sampling scheme and corresponding reconstructed image, in accordance with an embodiment of the present technique.

FIG. 2 shows, a schematic diagram 200 of an example k-space 202 acquired using a Partial Fourier and under-sampling scheme and corresponding reconstructed image 204. In the k-space 202, a portion 206 is first marked for PF acquisition and then a sub portion 208 within portion 206 is not acquired as per the under-sampling mask. The PF factor for portion 206 is determined based on timing parameters in the MRI pulse sequence such as echo spacing (i.e., the time interval between consecutive echo signals), etc. Designated as 210 in the figure, a set (also referred to as a target number) of k-space lines around the center are compulsorily acquired. In one embodiment, the target number of k-spaces lines include minimum of 12 k-space lines around the center of k-space. The white portion 210 in k-space represents these 12 k-space lines.

Following a target ETL (number of k-space lines to be acquired in the single shot) and the PF factor determination, a mask for k-space acquisition is generated using an under-sampling technique. In this under-sampling technique, alternate k-space lines 208, in the remaining k-space (excluding portion 210) are dropped for acquisition till the desired target ETL is achieved. The generated mask is then used for prospective k-space acquisition. It should be noted that the k-space acquisition technique using PF and under sampling scheme presented herein enhances the imaging process by reducing the inherent T2 blur in SSFSE images. For example, the acceleration factor (R) for FIG. 2 is 2.25.

Figure 3:
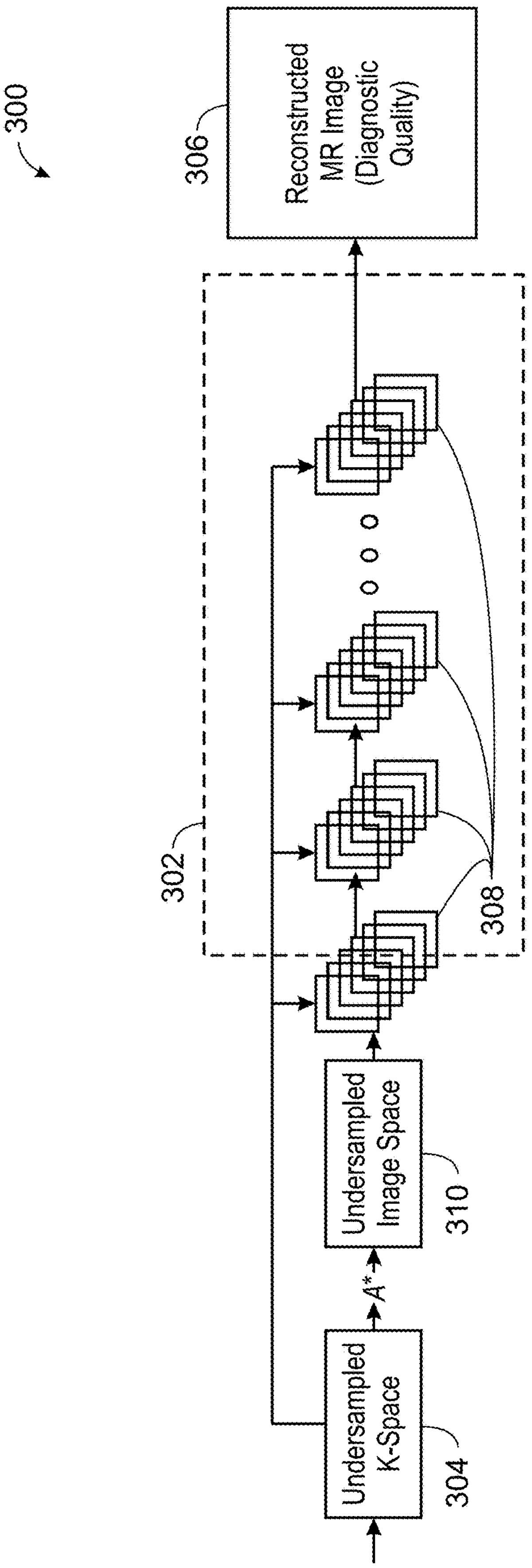
FIG. 3 shows a deep learning (DL) network employed for the reconstruction of a medical image, in accordance with an embodiment of the present technique.

FIG. 3 shows a schematic diagram 300 depicting a deep learning (DL) network 302 employed for the reconstruction of a medical image, in accordance with an embodiment of the present technique. In one embodiment, the DL network 302 may specifically be an unrolled algorithm-based DL network. However, it should be noted that other types of DL networks are also considered within the scope of this disclosure.

The unrolled algorithm-based DL network 302 is trained to learn MR reconstruction for the under-sampled k-space 304 acquired using the PF and under sampling scheme presented herein. In other words, the DL network 302 is designed to reduce or remove aliasing and blurring effect due to under-sampling and PF acquisition approach.

In one embodiment, the under-sampled k-space is first transformed into under-sampled image space 310 using techniques such as an inverse Fourier transform. The unrolled algorithm based DL network 302 illustrates a transformation that occurs as under-sampled image-space 310 is propagated through unrolling steps 308 to finally generate a reconstructed MR image 306. As discussed earlier, the k-space 304 is acquired with the acquisition technique using PF and under-sampling scheme shown in FIG. 2.

In one embodiment, the training process for DL network 302 involves using under-sampled image space data obtained using the k-space sampling strategy detailed in FIG. 2. This under-sampled image data serves as the input for the DL network. The corresponding fully sampled image space data, which represents the complete set of acquired data, is utilized as the ground truth output for comparison during training.

The goal of training the DL network is to minimize the differences or errors between the actual fully sampled input data (i.e., data prior to under-sampling) I and the predicted output data (i.e., reconstructed image data) Î. In one embodiment, the differences or errors may be represented by two measures: 1) mean absolute error (MAE) and 2) structural similarity index measure (SSIM). The MAE assesses the average magnitude of errors between the network's predicted outputs and the actual ground truth data. Further, the SSIM evaluates the similarity between the DL network's reconstructed images and the true images in terms of structural patterns and details. The MAE is represented as in equation (1) below:

$$\left\|\mathrm{Re}(I), \mathrm{Re}(\hat{I})\right\|_1 + \left\|\mathrm{Im}(I), \mathrm{Im}(\hat{I})\right\|_1 \quad (1)$$

where Re represents real component, Im represents imaginary component and subscript 1 corresponds to $L_1$ norm. Further, the SSIM is represented as in equation (2) below:

$$SSIM(\mathrm{abs}(I), \mathrm{abs}(\hat{I})) \quad (2)$$

In one embodiment, a weighted loss function $\mathcal{L}(I,\hat{I})$ for the DL network shown in FIG. 3 may be given as:

$$\mathcal{L}(I, \hat{I}) = \alpha \times \left(\left\|\mathrm{Re}(I), \mathrm{Re}(\hat{I})\right\|_1 + \left\|\mathrm{Im}(I), \mathrm{Im}(\hat{I})\right\|_1\right) + \beta \times SSIM(\mathrm{abs}(I), \mathrm{abs}(\hat{I})) \quad (3)$$

where abs represents magnitude of the complex image, $\alpha,\beta$ represent real valued weighting factors for the weighted loss function and can be any floating point values. In one embodiment, $\alpha=0.5$, $\beta=1.0$. In equation (3), the MAE loss function applied to both real and imaginary channels which ensures accurate reconstruction of complex data. This means that both the magnitude and phase components of the data are preserved in the reconstruction process. Additionally, the SSIM applied to magnitude ensures accurate preservation of structural information in the reconstructed images.

Figure 4:
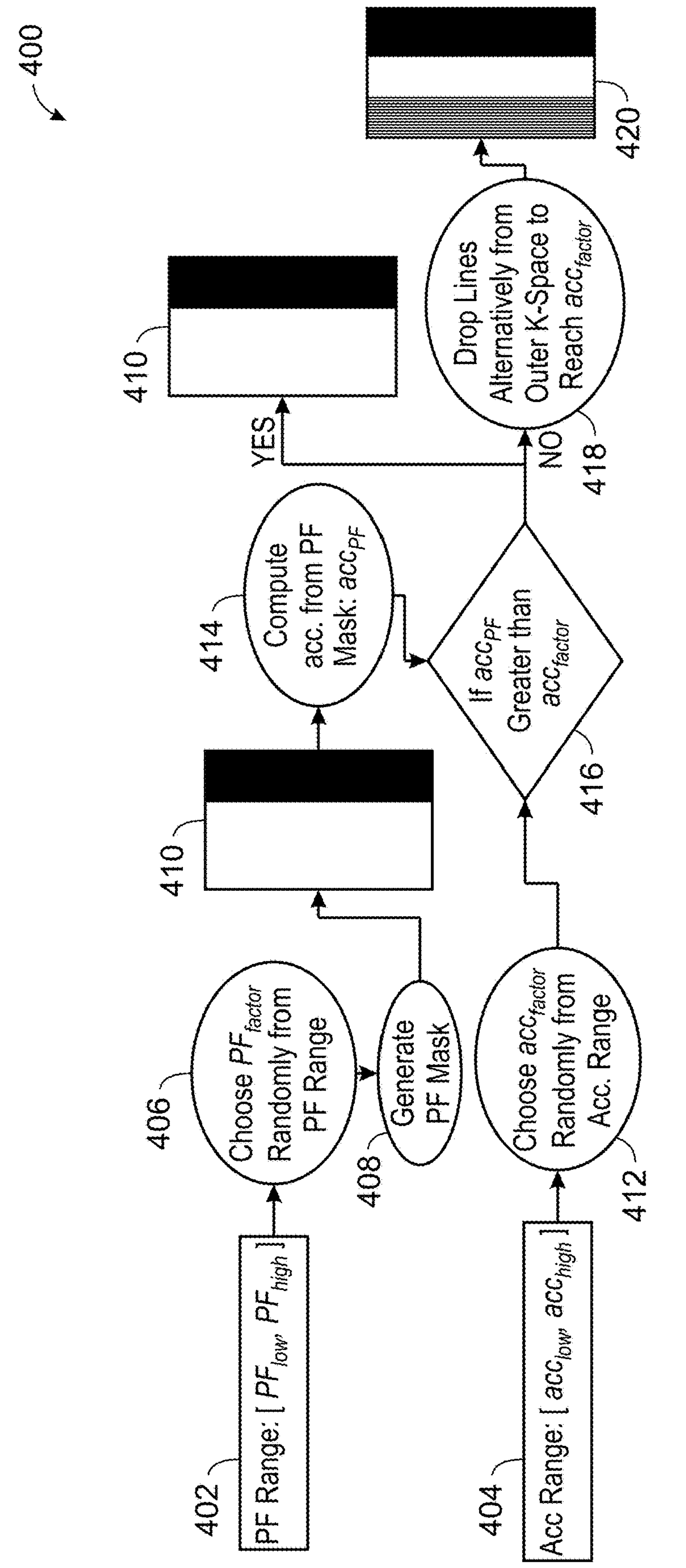
FIG. 4 shows a flowchart of generating datasets for training the DL network of FIG. 3, in accordance with an embodiment of the present technique.

FIG. 4 shows a flowchart 400 of generating datasets for training the DL network of FIG. 3. This flowchart details the steps involved in preparing the training data and generating the training masks used to train the DL network for image reconstruction from under-sampled k-space data. Regular spin echo data may be used for the training algorithm.

The training begins by defining a range of PF factors [$PF_{low}$, $PF_{high}$] at step 402 and range of acceleration factors [$acc_{low}$, $acc_{high}$] at step 404. The PF factors determine the extent of k-space data that will be acquired using the partial Fourier technique. In one embodiment, the PF factor range may be 0.51 to 0.7. These acceleration factors represent the level of under-sampling beyond the partial Fourier acquisition. In one embodiment, the acceleration factor range may be 1.7 to 2.5.

At step 406, a preliminary PF factor is randomly selected from the defined range of PF factors used in step 402. This randomization introduces variability into the training process, which can help the DL network generalize better to different under-sampling scenarios. Based on the chosen preliminary PF factor, a PF mask 410 is generated at step 408. This mask 410 indicates which lines of k-space data will be acquired and which will be omitted during the partial Fourier k-space acquisition step.

Further, at step 412, an acceleration factor referred to herein as a desired acceleration factor ($acc_{factor}$) is randomly selected from the defined range acceleration factors used in step 404. Moreover, a preliminary acceleration factor ($acc_{pf}$) is also determined from the PF mask 410 in step 414. At step 416, the desired acceleration factor and the preliminary acceleration factor are compared. If the preliminary acceleration factor is greater than the desired acceleration factor, then the mask 410 generated in step 408 is used for training the DL network for one iteration. However, if the preliminary acceleration factor is not greater than the desired acceleration factor then at step 418, additional lines are dropped from a periphery of k-space mask 410 in an alternating pattern until the desired acceleration factor is reached. The final mask generated with this process is shown as mask 420. From FIG. 4, it can be seen that the trained reconstruction module can be used for a wide range of scenarios including PF alone technique and PF combined with under-sampling technique.

Figure 5:
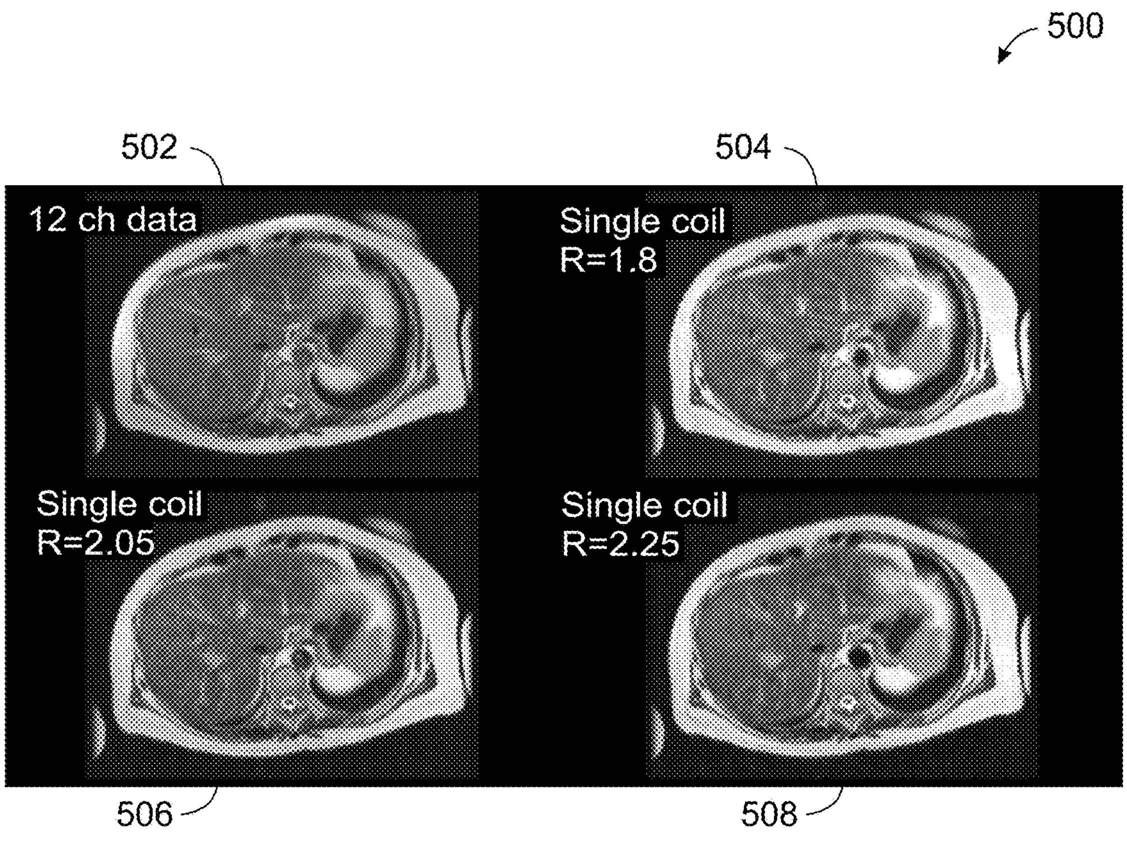
FIG. 5 shows a pictorial view of a volunteer abdomen obtained using a technique presented herein, in accordance with an embodiment of the present technique.

FIG. 5 shows a pictorial view 500 of a volunteer abdomen. Specifically, FIG. 5 has an image 502 of the volunteer abdomen acquired using at 1.5 T commercial MRI scanner using 12 channel body array coil. The volunteer was also scanned using the single coil k-space acquisition technique described herein with. A sample acquisition mask used for prospective data collection has been shown in FIG. 2. Reconstructions for prospective data acquired on single coil with acceleration factors R={1.8, 2.05, 2.25} are shown in images 504, 506 and 508 respectively. Acquisition times for the images 504, 506 and 508 were 15 seconds, 13 seconds, and 12 seconds respectively. Notably, these images showcase the successful retention of key aspects of the abdominal image, even when employing a single coil compared to the more conventional 12-channel body array coil and higher level of acceleration factor (i.e., lesser acquisition time). This observation underscores the efficacy and robustness of the presented technique in reducing MRI scan time for SSFSE, thus reducing inherent blurring, while preserving critical image features.

The images in 504, 506 and 508 were rated based on the Likert scale by a senior radiologist with more than 30 years of experience. Across three levels of acceleration, images received a rating of 'good'. As will be appreciated by those skilled in the art, the 'good' rating in Likert scale is "Deemed as containing all critical criteria for making the same diagnosis as was completed with the clinical exam. Possibly has other image quality differences."

Figure 6:
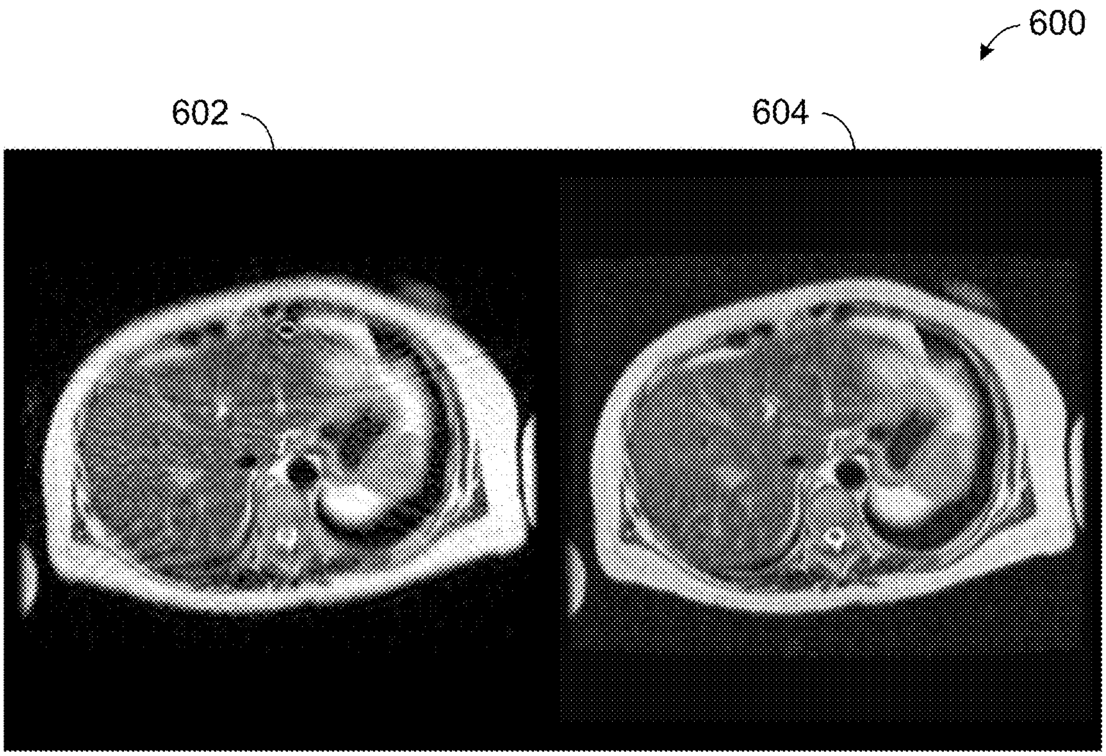
FIG. 6 shows a pictorial view comparing results of image reconstruction with a zero filled reconstruction technique and a DL reconstruction technique presented herein.

FIG. 6 shows a pictorial diagram 600 comparing results of image reconstruction with a zero filled reconstruction technique and a DL reconstruction technique presented herein. In particular, image 602 illustrates an abdominal image reconstructed using the traditional zero fill technique, which involves the inverse Fourier transform. On the other hand, image 604 displays an abdominal image reconstructed using the DL reconstruction technique described in FIG. 3 herein.

Both reconstruction techniques utilized the same k-space data, acquired using the partial Fourier and under-sampled technique presented herein. However, a noticeable difference is observed between the two reconstructed images. Image 604, reconstructed with the DL technique, exhibits significantly sharper details compared to image 602, reconstructed using the conventional zero fill technique. This improvement in image sharpness demonstrates the effectiveness and superiority of the DL reconstruction method over traditional techniques, thereby enhancing the overall quality of reconstructed MRI images.

Figure 7:
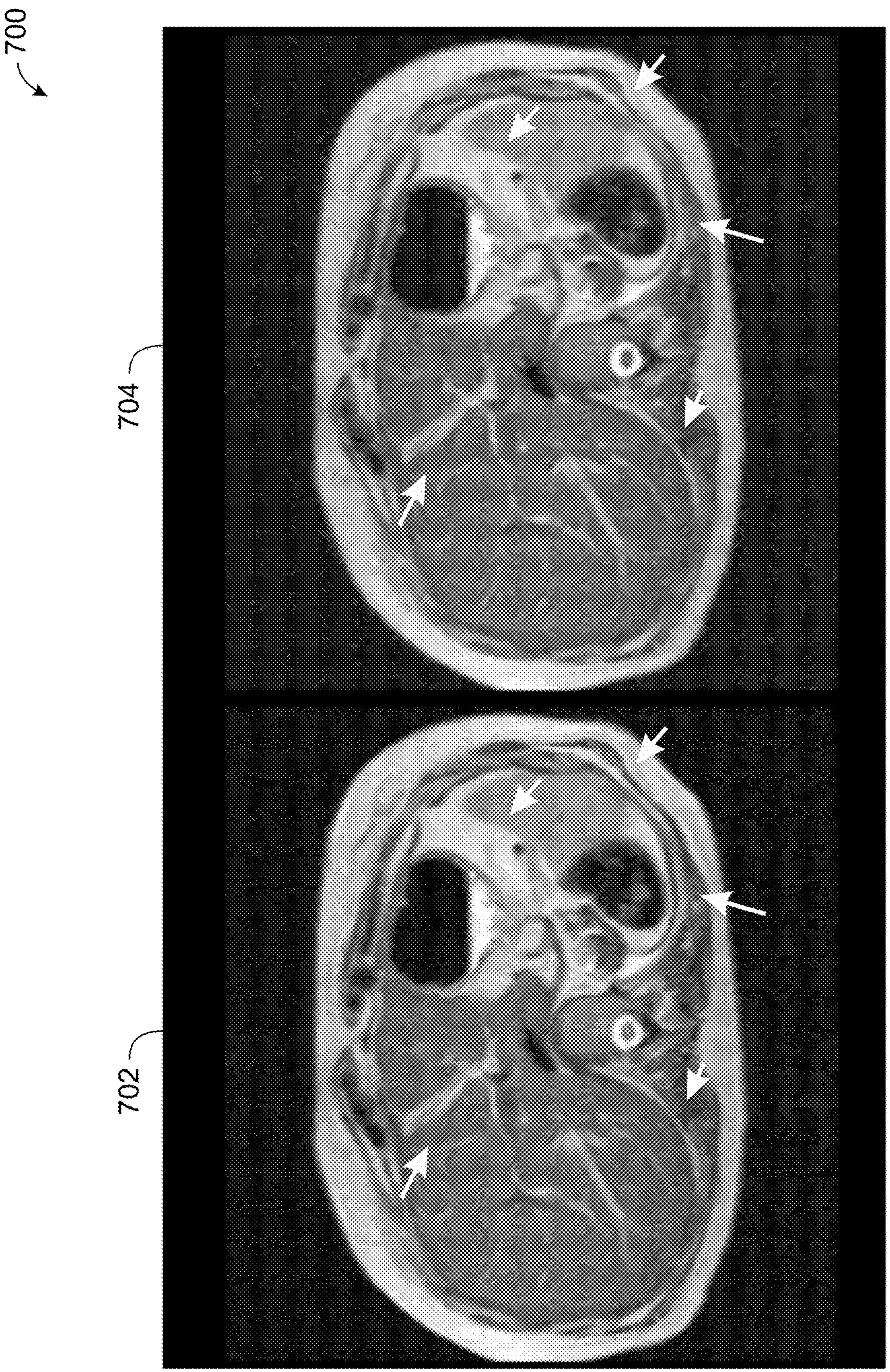
FIG. 7 shows a pictorial diagram comparing results of image reconstruction with a classical homodyne reconstruction technique and a DL reconstruction technique presented herein.

FIG. 7 shows a pictorial diagram 700 comparing results of image reconstruction with a classical homodyne reconstruction technique and a DL reconstruction technique presented herein. Specifically, image 704 illustrates an abdominal image reconstructed using the classical homodyne reconstruction technique. In this technique, the k-space data acquisition solely employed the partial Fourier technique without any under-sampling. In contrast, image 702 displays an abdominal image reconstructed using the DL reconstruction technique described in FIG. 3 herein. For image 702, the k-space data was acquired using the partial Fourier and under-sampled technique presented herein.

A noticeable difference is evident between images 702 and 704. Image 702, reconstructed using the DL technique, exhibits better delineation of structures, particularly at pointed locations and other regions, compared to image 704 reconstructed using the classical homodyne technique. Moreover, image 704 displays wormhole artifacts (i.e., signal loss), which are absent in image 702. These comparisons highlight the superior performance and artifact mitigation capabilities of the DL reconstruction method over traditional homodyne techniques in producing high-quality MRI images.

Figure 8:
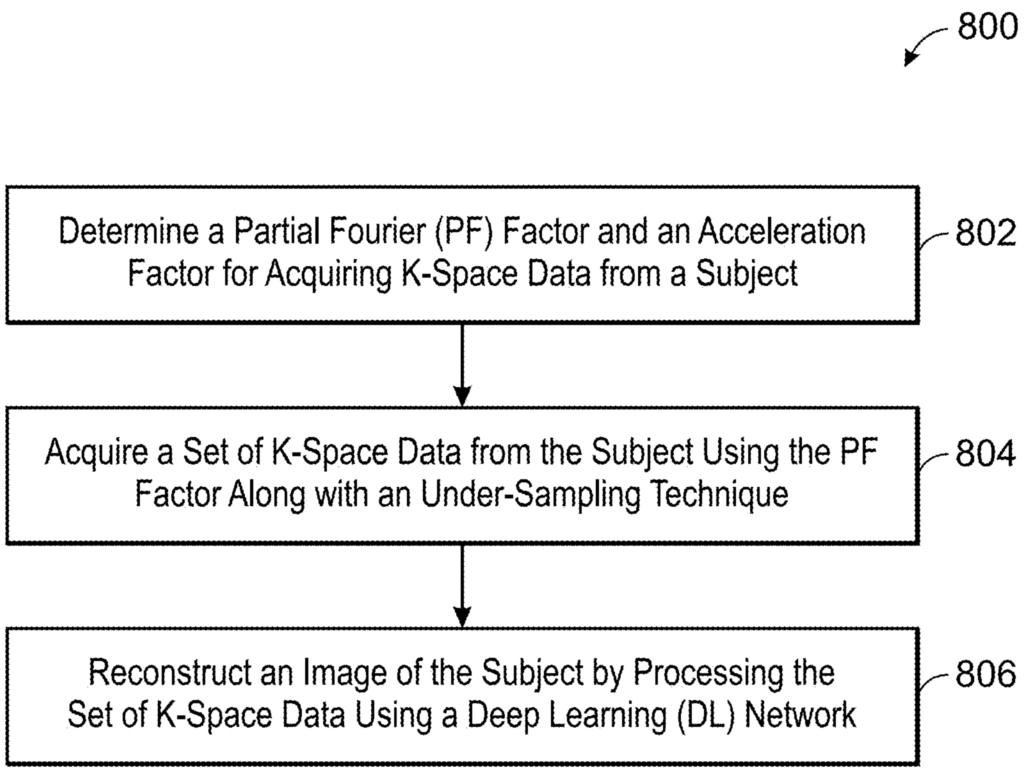
FIG. 8 shows a flow chart illustrating a method for magnetic resonance imaging, according to an embodiment of the present technique.

FIG. 8 shows a flow chart 800 depicting a magnetic resonance imaging (MRI) method, in accordance with an embodiment of the present technique. In one embodiment, the MRI method includes SSFSE T2 imaging method. Method 800 may be carried out according to instructions stored in non-transitory memory of a computing device, such as image processor 22.

At step 802, the method includes determining a Partial Fourier (PF) and an acceleration factor for acquiring k-space data from a subject. In method 800, a pre-decided number of k-space lines are retained around the center of k-space region. In one embodiment, the target number of k-spaces lines include minimum of 12 k-space lines around the center of k-space.

At step 804, the method includes acquiring a set of k-space data from the subject using the PF factor along with an under-sampling technique. The under-sampling technique is dependent on the acceleration factor determined in step 802. In one embodiment, the set of k-space data is acquired using only a single radio frequency coil. Since only one coil is used, it can offer more comfort to the patient during the scan, especially in terms of positioning and ease of use.

Further, to acquire the set of k-space data, a portion of the k-space may be first marked based on the PF factor and then a sub-portion in that portion is acquired using an under-sampling mask. The under-sampling mask is based on the desired acceleration factor.

Further at step 806, the method includes reconstructing an image of the subject by processing the set of k-space data using a deep learning (DL) network. In one embodiment, the DL network may be based on an unrolled algorithm. Further, in another embodiment, the DL network is trained using under-sampled data corresponding to a range of partial Fourier factors and a range of acceleration levels or acceleration factors. In another embodiment, the DL network may use the loss function from equation (3).

In yet another embodiment, the DL network is trained using following steps: 1) randomly selecting a preliminary PF factor and a desired acceleration factor from the range of partial Fourier and acceleration factors; 2) generating a preliminary PF mask based on the preliminary PF factor; 3) determining a preliminary acceleration factor based on the preliminary PF mask; and 4) dropping additional k-space lines in an alternating pattern from a periphery of the preliminary PF mask until the desired acceleration factor is reached, in case where the preliminary acceleration factor is not greater than the desired acceleration factor or does not satisfy the desired acceleration factor.

As discussed herein, the DL network or technology (also referred to as deep machine learning, hierarchical learning, deep structured learning, or the like) employs an artificial neural network for learning. The deep learning method is characterized by using one or a plurality of network architectures to extract or simulate data of interest. The deep learning method may be implemented using one or a plurality of processing layers (for example, an input layer, an output layer, a convolutional layer, a normalization layer, or a sampling layer, where processing layers of different numbers and functions may exist according to different deep learning network models), where the configuration and number of the layers allow a deep learning network to process complex information extraction and modeling tasks. Specific parameters (or referred to as "weight" or "bias") of the network are usually estimated through a so-called learning process (or training process). The learned or trained parameters usually result in (or output) a network corresponding to layers of different levels, so that extraction or simulation of different aspects of initial data or the output of a previous layer usually may represent the hierarchical structure or concatenation of layers. Thus, processing may be performed layer by layer. That is, "simple" features may be extracted from input data for an earlier or higher-level layer, and then these simple features are combined into a layer exhibiting features of higher complexity. In practice, each layer (or more specifically, each "neuron" in each layer) may process input data as output data for representation using one or a plurality of linear and/or non-linear transformations (so-called activation functions). The number of the plurality of "neurons" may be constant among the plurality of layers or may vary from layer to layer.

As discussed herein, a training data set having known input values (for example, k-space data, etc.,) and known or expected output values (for example, reconstructed image) may be employed as part of initial training of a deep learning process that solves a specific problem. In this manner, a deep learning algorithm may process a known data set or training data set (in a supervised or guided manner or an unsupervised or unguided manner), until a mathematical relationship between initial data and an expected output is identified and/or a mathematical relationship between the input and output of each layer is identified and characterized. (Partial) input data is usually used, and a network output is created for the input data in the learning process. Afterwards, the created output is compared with the expected (target) output of the data set, and then a generated difference from the expected output is used to iteratively update network parameters (weight and offset). One such update/learning mechanism uses a stochastic gradient descent method to update a network parameter. Apparently, those skilled in the art should understand that other methods known in the art may also be utilized. Similarly, a separate validation data set may be used, where both an input and an expected target value are known, but only an initial value is provided to a trained deep learning algorithm, and then an output is compared with an output of the deep learning algorithm to validate prior training and/or prevent excessive training.

Based on the description above, an embodiment of the present invention may further provide a computer-readable storage medium in which computer-readable instructions are stored, and the computer-readable instructions are configured to control a magnetic resonance scanning system to perform the image display method according to any one of the embodiments described above. The computer-readable storage medium may be similar to the storage medium in the controller 33 in the system shown in FIG. 1.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for magnetic resonance imaging (MRI) comprising:

determining a Partial Fourier (PF) factor and an acceleration factor for acquiring k-space data from a subject;

acquiring a set of k-space data from the subject using the PF factor along with an under-sampling technique, wherein the under-sampling technique is dependent on the acceleration factor; and reconstructing an image of the subject by processing the set of k-space data using a deep learning (DL) network.

2. A magnetic resonance imaging (MRI) system, comprising:

a magnet configured to generate a polarizing magnetic field about at least a portion of a subject arranged in the MRI system;

a gradient coil assembly including a readout gradient coil, a phase gradient coil, a slice selection gradient coil configured to apply at least one gradient field to the polarizing magnetic field;

a radio frequency (RF) system configured to apply an RF field to the subject and to receive magnetic resonance signals from the subject; and a processing system programmed to:

determine a Partial Fourier (PF) factor and an acceleration factor for acquiring k-space data from the subject;

acquire a set of k-space data from the subject using the PF factor along with an under-sampling technique, wherein the under-sampling technique is dependent on the acceleration factor; and reconstruct an image of the subject by processing the set of k-space data using a deep learning (DL) network.

3. A non-transitory computer-readable medium comprising instructions, which when executed by a computer, cause the computer to carry out a method for Single Shot Fast Spin Echo (SSFSE) T2 magnetic resonance imaging, the method comprising the steps of:

determining a Partial Fourier (PF) factor and an acceleration factor for acquiring k-space data from a subject;

acquiring a set of k-space data from the subject using the PF factor along with an under-sampling technique, wherein the under-sampling technique is dependent on the acceleration factor; and reconstructing an image of the subject by processing the set of k-space data using a deep learning (DL) network.

4. The method of claim 1, wherein the PF factor is determined based on echo spacing.

5. The method of claim 1, wherein acquiring the set of k-space data from the subject using the PF factor along with the under-sampling technique comprises marking a portion of a k-space based on the PF factor and then a sub-portion in that portion is acquired using an under-sampling mask.

6. The method of claim 1, wherein the DL network is trained using under-sampled data corresponding to a range of partial Fourier factors and a range of acceleration levels.

7. The method of claim 1, wherein the DL network is based on an unrolled algorithm based deep learning reconstruction.

8. The method of claim 1, wherein the DL network employs a weighted loss function that includes a weighted combination of a mean absolute error and a structural similarity index measure (SSIM).

9. The method of claim 1, wherein acquiring the set of k-space data comprises acquiring the set of k-space data using only a single radio frequency coil.

10. The MRI system of claim 2, wherein the PF factor is determined based on echo spacing.

11. The MRI system of claim 2, wherein the DL network is trained using under-sampled data corresponding to a range of partial Fourier factors and a range of acceleration levels.

12. The MRI system of claim 2, wherein the DL network is based on an unrolled algorithm based deep learning reconstruction.

13. The MRI system of claim 2, wherein the DL network employs a weighted loss function that includes a weighted combination of a mean absolute error and a structural similarity index measure (SSIM).

14. The non-transitory computer-readable medium of claim 3, wherein the instructions for acquiring the set of k-space data from the subject using the PF factor along with the under-sampling technique comprises instructions for marking a portion of a k-space based on the PF factor and then a sub-portion in that portion is acquired using an under-sampling mask.

15. The non-transitory computer-readable medium of claim 3, wherein the DL network is trained using under-sampled data corresponding to a range of partial Fourier factors and a range of acceleration levels.

16. The method of claim 6, wherein the DL network is trained using following steps:

randomly selecting a preliminary PF factor from the range of partial Fourier factors and a desired acceleration factor from the range of acceleration levels;

generating a preliminary PF mask based on the preliminary PF factor;

determining a preliminary acceleration factor based on the preliminary PF mask; and dropping additional k-space lines in an alternating pattern from a periphery of the preliminary PF mask until the desired acceleration factor is reached if the preliminary acceleration factor does not satisfy the desired acceleration factor.

17. The method of claim 8, wherein the weighted loss function is represented as:

$$\mathcal{L}(I, \hat{I}) = \alpha \times \left(\left\|\mathrm{Re}(I), \mathrm{Re}(\hat{I})\right\|_1 + \left\|\mathrm{Im}(I), \mathrm{Im}(\hat{I})\right\|_1\right) + \beta \times SSIM\left(\mathrm{abs}(I), \mathrm{abs}(\hat{I})\right)$$

where £(I, Î) is the weighted loss function showing error between actual input data I and the predicted output data Î, and α, β represent weighting factors.

18. The MRI system of claim 11, wherein the processing system is programmed to train the DL network using following steps:

randomly selecting a preliminary PF factor from the range of partial Fourier factors and a desired acceleration factor from the range of acceleration levels;

generating a preliminary PF mask based on the preliminary PF factor;

determining a preliminary acceleration factor based on the preliminary PF mask; and dropping additional k-space lines in an alternating pattern from a periphery of the preliminary PF mask until the desired acceleration factor is reached if the preliminary acceleration factor does not satisfy the desired acceleration factor.

19. The MRI system of claim 13, wherein the weighted loss function is represented as:

$$\mathcal{L}(I, \hat{I}) = \alpha \times \left(\left\|\mathrm{Re}(I), \mathrm{Re}(\hat{I})\right\|_1 + \left\|\mathrm{Im}(I), \mathrm{Im}(\hat{I})\right\|_1\right) + \beta \times SSIM\left(\mathrm{abs}(I), \mathrm{abs}(\hat{I})\right)$$

where £(I, Î) is the weighted loss function showing error between actual input data I and the predicted output data Î, and α, β represent weighting factors.

20. The MRI system of claim 19, wherein the processing system is programmed to acquire the set of k-space data using only a single radio frequency coil.

* * * * *